United States Patent
Rhee

(10) Patent No.: US 9,825,067 B2
(45) Date of Patent: Nov. 21, 2017

(54) DISPLAY DEVICE USING SEMICONDUCTOR LIGHT EMITTING DEVICE

(71) Applicant: LG ELECTRONICS INC., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/205,729

(22) Filed: Jul. 8, 2016

(65) Prior Publication Data

US 2017/0207249 A1    Jul. 20, 2017

(30) Foreign Application Priority Data

Jan. 18, 2016   (KR) ........................ 10-2016-0006120

(51) Int. Cl.
| | |
|---|---|
| *H01L 29/04* | (2006.01) |
| *H01L 27/12* | (2006.01) |
| *H01L 33/42* | (2010.01) |
| *H01L 27/32* | (2006.01) |
| *G09G 3/3233* | (2016.01) |

(52) U.S. Cl.
CPC ....... *H01L 27/1248* (2013.01); *G09G 3/3233* (2013.01); *H01L 27/124* (2013.01); *H01L 27/1259* (2013.01); *H01L 27/3211* (2013.01); *H01L 27/3248* (2013.01); *H01L 27/3258* (2013.01); *H01L 27/3276* (2013.01); *H01L 33/42* (2013.01); *G09G 2300/0809* (2013.01); *G09G 2320/0271* (2013.01); *G09G 2330/028* (2013.01); *H01L 27/3288* (2013.01); *H01L 2227/323* (2013.01)

(58) Field of Classification Search
CPC ............... H01L 27/1248; H01L 27/124; H01L 27/1259; H01L 27/3248; H01L 27/3258; G09G 3/3233
See application file for complete search history.

(56) References Cited

U.S. PATENT DOCUMENTS

| | | | |
|---|---|---|---|
| 7,514,963 B2 | 4/2009 | Nishikawa | |
| 2008/0018245 A1 | 1/2008 | Kim et al. | |
| 2013/0308076 A1 | 11/2013 | Yasumatsu | |

FOREIGN PATENT DOCUMENTS

| | | |
|---|---|---|
| KR | 10-1476207 B1 | 12/2014 |
| WO | WO 2015/166222 A1 | 11/2015 |

*Primary Examiner* — Elias M Ullah
(74) *Attorney, Agent, or Firm* — Birch, Stewart, Kolasch & Birch, LLP

(57) ABSTRACT

A display device including a pixel electrode portion electrically connected to a thin film transistor; a semiconductor light emitting device configured to emit light to form an individual pixel, and including a conductive electrode; a conductive adhesive layer adhered to the semiconductor light emitting device, and configured to electrically connect the pixel electrode portion to the conductive electrode; and a buffer layer including an elastic material to protect the thin film transistor, and disposed between the thin film transistor and the conductive adhesive layer.

15 Claims, 13 Drawing Sheets

DISPLAY DEVICE USING SEMICONDUCTOR LIGHT EMITTING DEVICE

CROSS-REFERENCE TO RELATED APPLICATIONS

This application claims the benefit of priority of Korean Patent Application No. 10-2016-0006120, filed on Jan. 18, 2016, which is herein expressly incorporated by reference in their entireties.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as slow response time, difficult implementation of flexibility in case of LCDs, and there exist drawbacks such as short life span, poor yield as well as low flexibility in case of AMOLEDs.

Further, light emitting diodes (LEDs) convert an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

A flexible display using the semiconductor light emitting devices may be fabricated by a process of bonding a wiring substrate to a semiconductor light emitting device using a conductive adhesive layer. In particular, when the wiring substrate is electrically connected to a conductive electrode of the semiconductor light emitting device using an anisotropy conductive film (ACF), a thin film transistor may be damaged or destroyed during the bonding process. Further, studies for reducing defects during the bonding process have not been thoroughly performed.

SUMMARY OF THE INVENTION

Accordingly, one aspect of the present disclosure is to enhance a yield in a wiring process of semiconductor light emitting devices.

Another aspect of the present disclosure is to implement a structure of decentralizing an impact applied to a thin film transistor in an active matrix (AM) type.

Still another aspect of the present disclosure is to secure a margin of gradation expression in an active matrix (AM) type.

A display device according to an embodiment of the present disclosure may include a pixel electrode portion electrically connected to a thin film transistor, a semiconductor light emitting device configured to emit light to form an individual pixel, and provided with a conductive electrode, a conductive adhesive layer adhered to the semiconductor light emitting device, and configured to electrically connect the pixel electrode portion to the conductive electrode, and a buffer layer formed of an elastic material to protect the thin film transistor, and disposed between the thin film transistor and the conductive adhesive layer.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
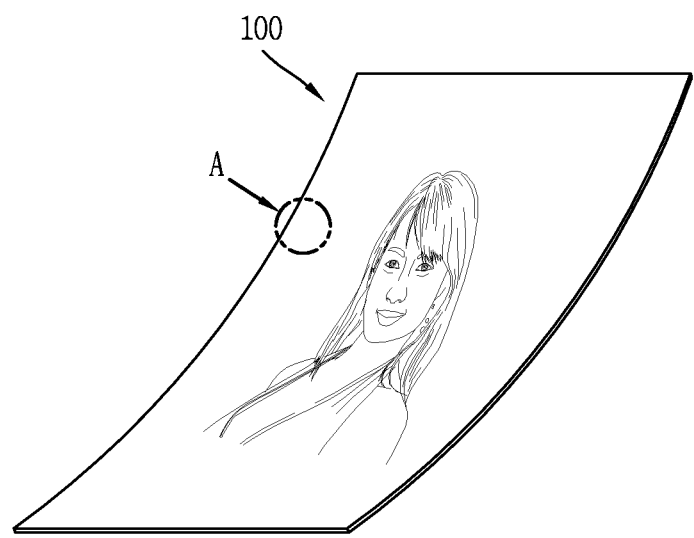
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to an embodiment of the present disclosure, a light emitting diode (LED) is illustrated as a type of semiconductor light emitting device. The light emitting diode can be formed with a small size to perform the role of a sub-pixel even in the second configuration through this.

Figure 2:
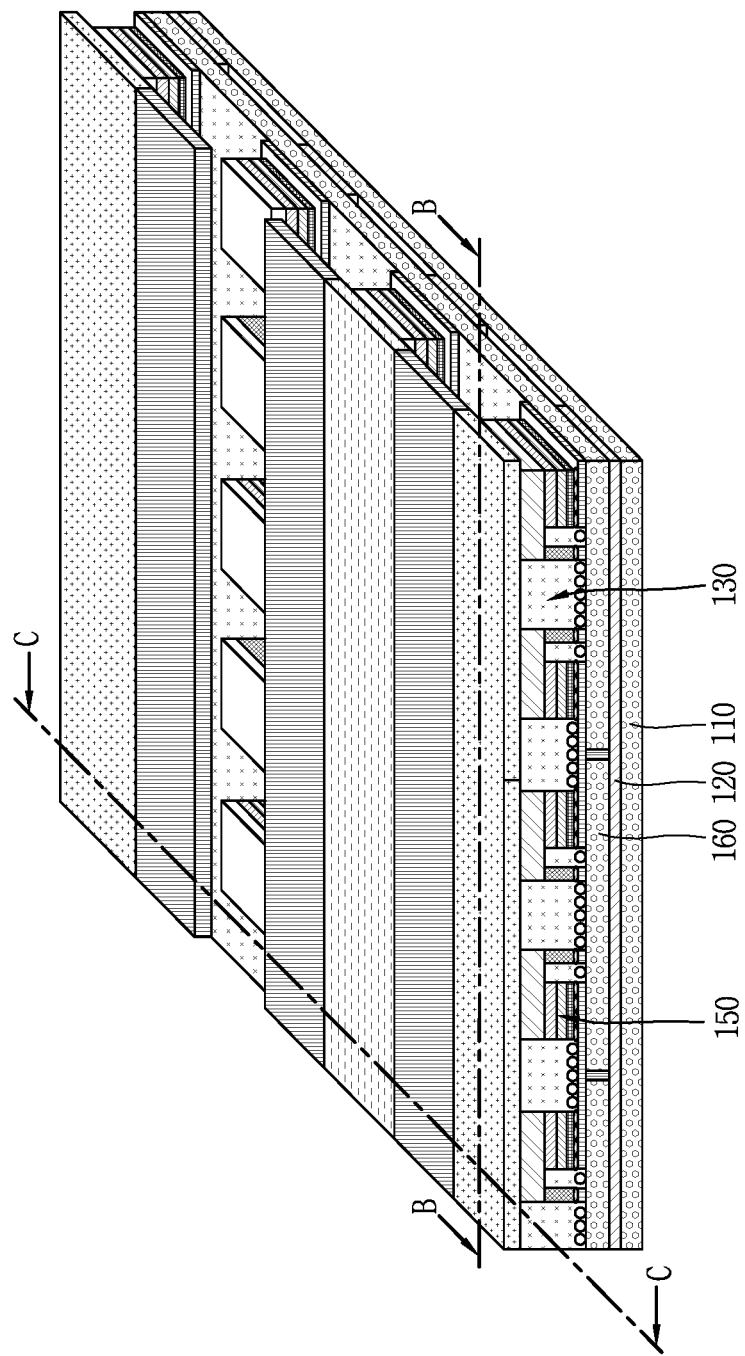
FIG. 2 is a partial enlarged view of portion "A" in FIG. 1, and FIGS. 3A and 3B are cross-sectional views taken along lines B-B and C-C in FIG. 2.

Hereinafter, a flexible display implemented using the light emitting diode will be described in more detail with reference to the accompanying drawings. FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 3A:
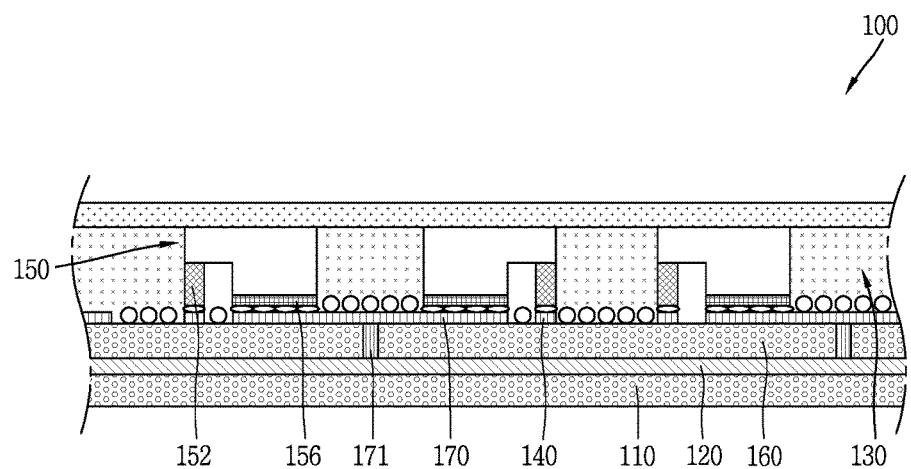
Figure 3B:
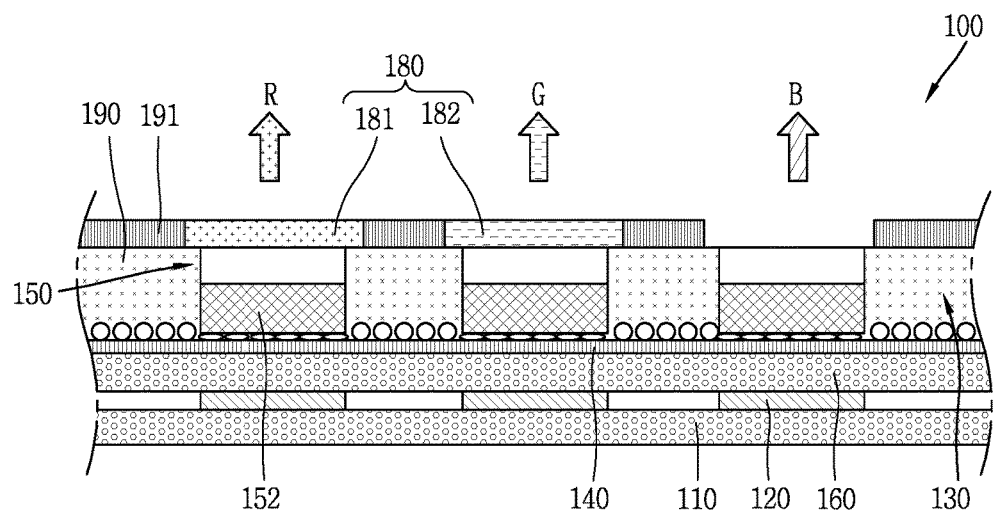
Figure 4:
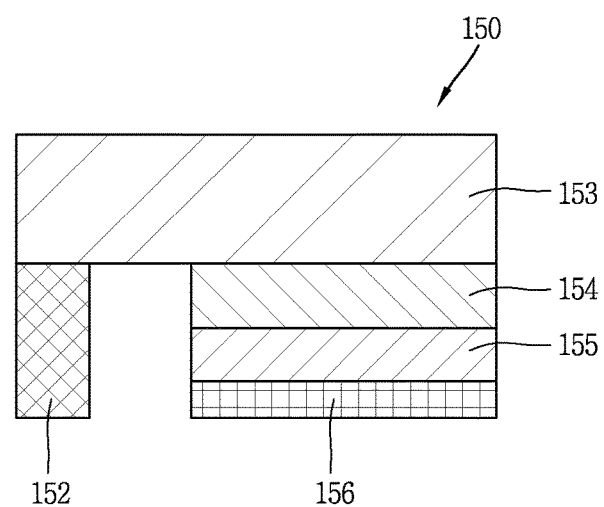
FIG. 4 is a conceptual view illustrating a flip-chip type semiconductor light emitting device in FIG. 3A.

FIGS. 2, 3A and 3B illustrate a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 includes a substrate 110, a first electrode 120, a conductive adhesive layer 130, a second electrode 140, and a plurality of semiconductor light emitting devices 150. The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials. The substrate 110 may be a wiring substrate disposed with the first electrode 120, and thus the first electrode 120 may be placed on the substrate 110.

According to the drawing, an insulating layer 160 is disposed on the substrate 110 placed with the first electrode 120, and an auxiliary electrode 170 is placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

Further, the auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by an electrode hole 171 passing through the insulating layer 160. The electrode hole 171 can be formed by filling a conductive material in a via hole.

Referring to the drawings, the conductive adhesive layer 130 can be formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and a conductive material and an adhesive material may be mixed on the conductive adhesive layer 130. Furthermore, the conductive adhesive layer 130 may have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but may be configured as a layer having electrical insulation in the horizontal x-y direction thereof. Accordingly, the conductive adhesive layer 130 can be referred to as a z-axis conductive layer (however, hereinafter referred to as a "conductive adhesive layer").

The anisotropic conductive film includes an anisotropic conductive medium mixed with an insulating base member, and thus when heat and pressure are applied thereto, only a specific portion thereof can have conductivity by the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by the conductive balls. The anisotropic conductive film may be in a state in which a core with a conductive material contains a plurality of particles coated by an insulating layer with a polymer material, and in this instance, it may have conductivity by the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may be in a state containing a plurality of particles in which a conductive material is coated on insulating cores.

In this instance, a portion to which heat and pressure are applied may be converted (pressed and adhered) to a conductive material to have conductivity in the thickness direction of the film. For still another example, it can be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) including conductive balls inserted into one surface of the insulating base member. More specifically, the insulating base member includes an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or be a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 can be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array. The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 can be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator. In another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
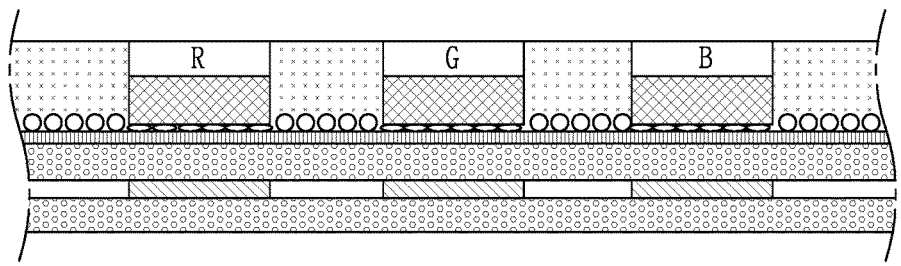
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
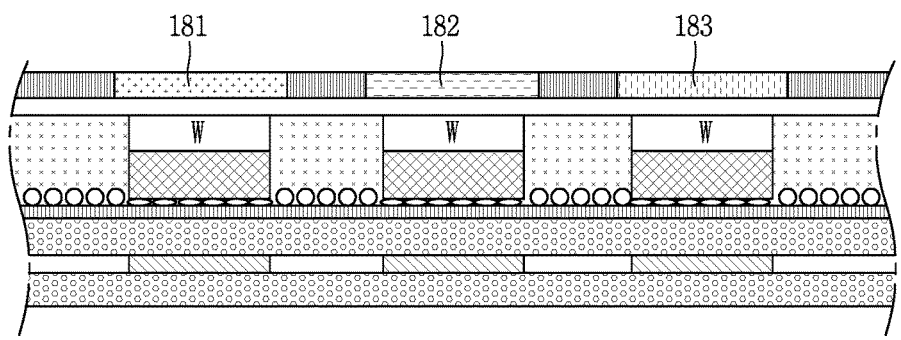

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
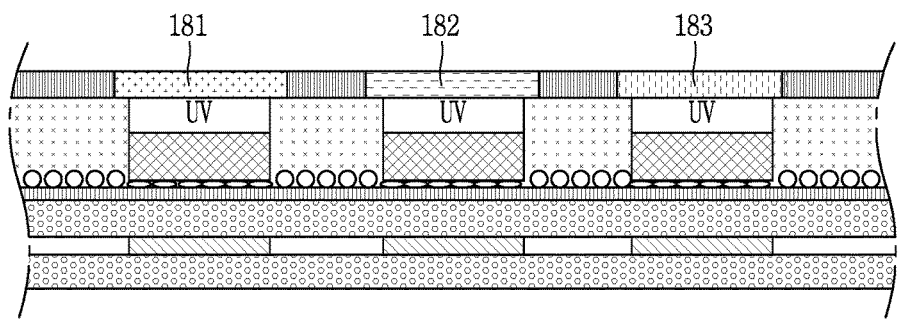

Referring to FIG. 5C, it is possible to also have a structure in which a red phosphor layer 181, a green phosphor layer 182 and blue phosphor layer 183 may be provided on a ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it is possible to configure individual sub-pixels even with a small size thereof. The size of the individual semiconductor light emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting devices becomes sufficiently large. Accordingly, in this instance, it is possible to implement a flexible display device having a HD image quality.

Figure 6:
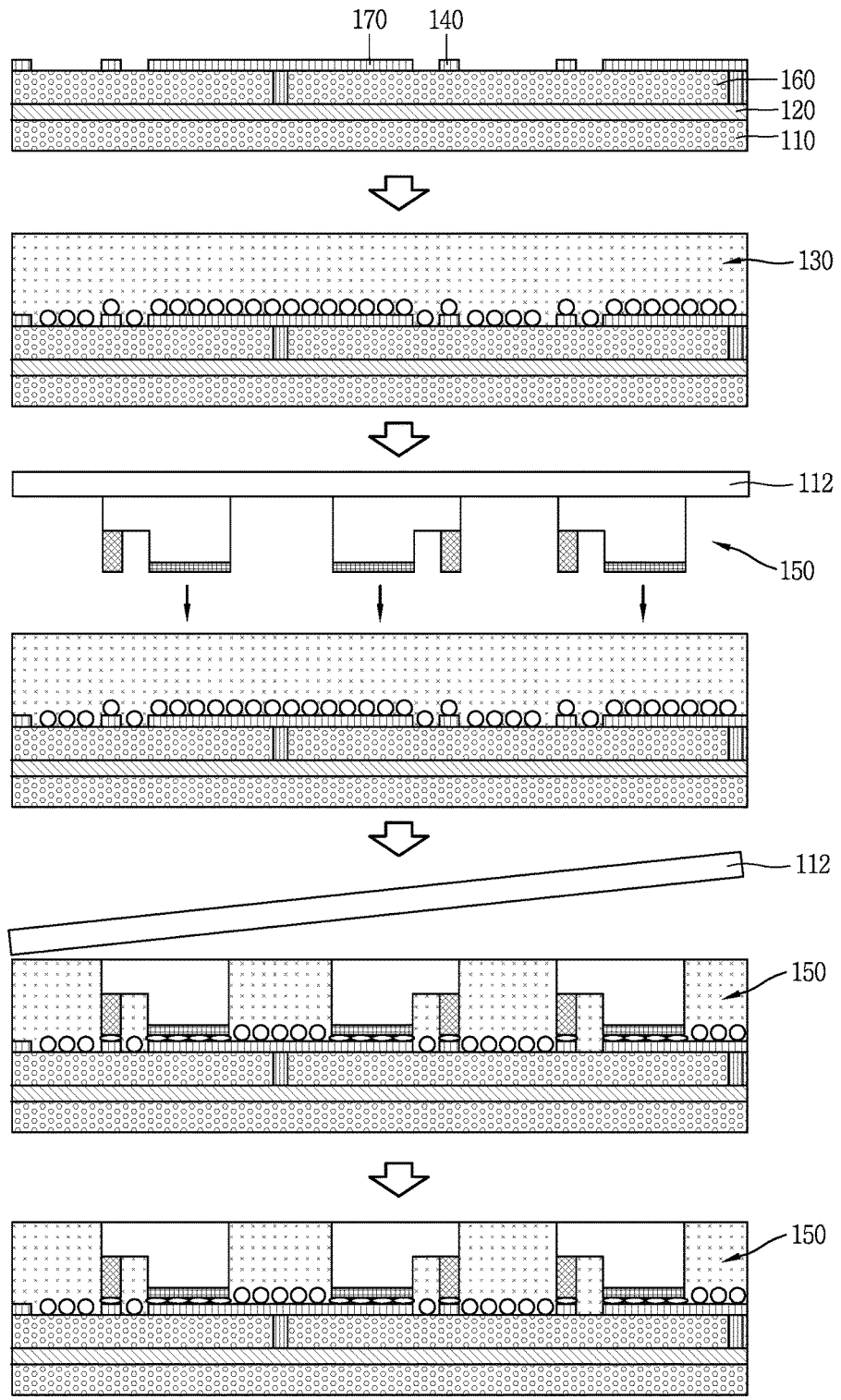
FIG. 6 is cross-sectional views illustrating a fabrication method of a display device using a semiconductor light emitting device according to an embodiment of the present disclosure.

A display device using the foregoing semiconductor light emitting device will be fabricated by a novel type of fabrication method. Hereinafter, the fabrication method will be described with reference to FIG. 6. In particular, FIG. 6 includes cross-sectional views illustrating a method of fabricating a display device using a semiconductor light emitting device according to an embodiment of the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and an anisotropic conductive film may be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate. The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

In addition, a phosphor layer can be formed on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6. Furthermore, according to the following modified example or embodiment, the same or similar reference numerals are designated to the same or similar configurations to the foregoing example, and the description thereof will be substituted by the earlier description.

Figure 7:
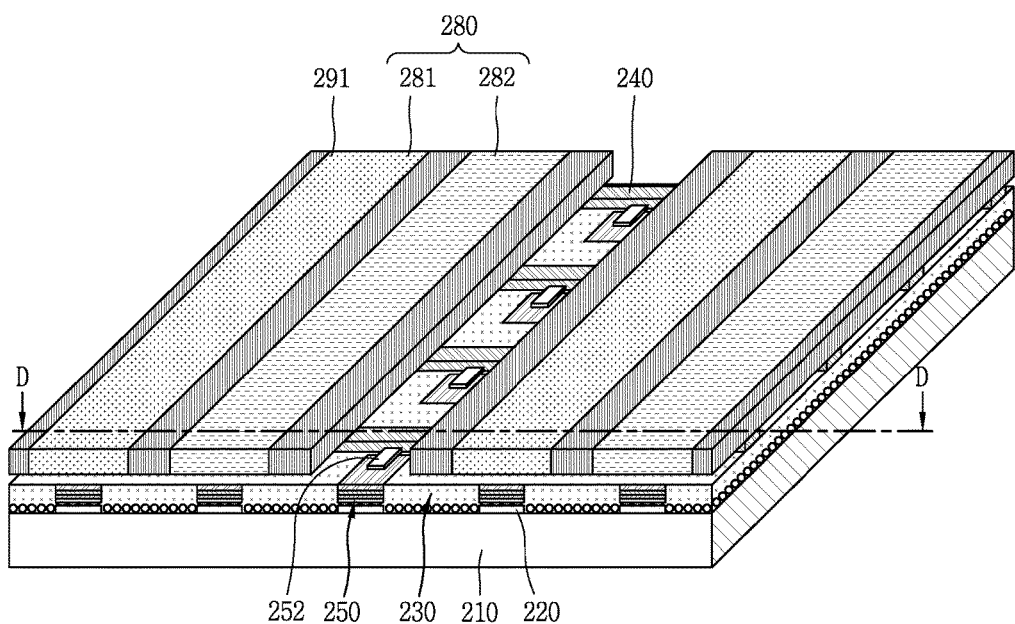
FIG. 7 is a perspective view illustrating a display device using a semiconductor light emitting device according to another embodiment of the present disclosure.
Figure 8:
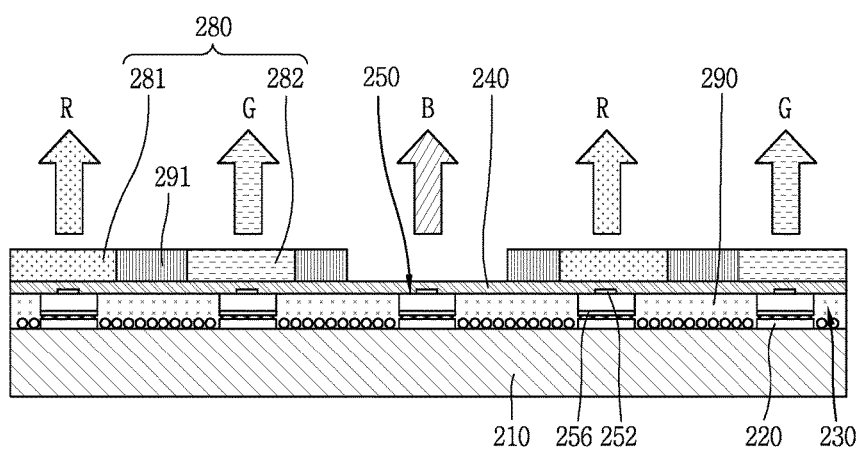
FIG. 8 is a cross-sectional view taken along line D-D in FIG. 7.
Figure 9:
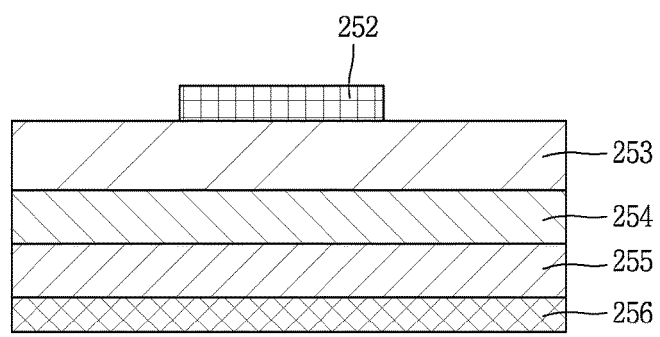
FIG. 9 is a conceptual view illustrating a vertical type semiconductor light emitting device in FIG. 8.

FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8.

According to the drawings, the display device can use a passive matrix (PM) type of vertical semiconductor light emitting device. The display device includes a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material. The first electrode 220 may be located on the substrate 210, and formed with a bar-shaped electrode elongated in one direction. The first electrode 220 can be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device.

The semiconductor light emitting device 250 may have excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure. A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 can be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. The second electrode 240 can be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) can be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 can be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance. As described above, the semiconductor light emitting device 250 is located on the conductive adhesive layer 230, thereby constituting individual pixels on the display device.

Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

The foregoing examples of the present disclosure have a passive matrix (PM) structure. The foregoing examples may be also applicable to an active matrix (AM) type semiconductor light emitting device, but in this instance, it may cause a problem in that a thin film transistor is damaged or destroyed during a bonding process of electrically connecting a wiring electrode to a semiconductor light emitting device. The present disclosure presents a mechanism capable of solving such a problem, and hereinafter, another embodiment of the present disclosure having the mechanism will be described.

Figure 10:
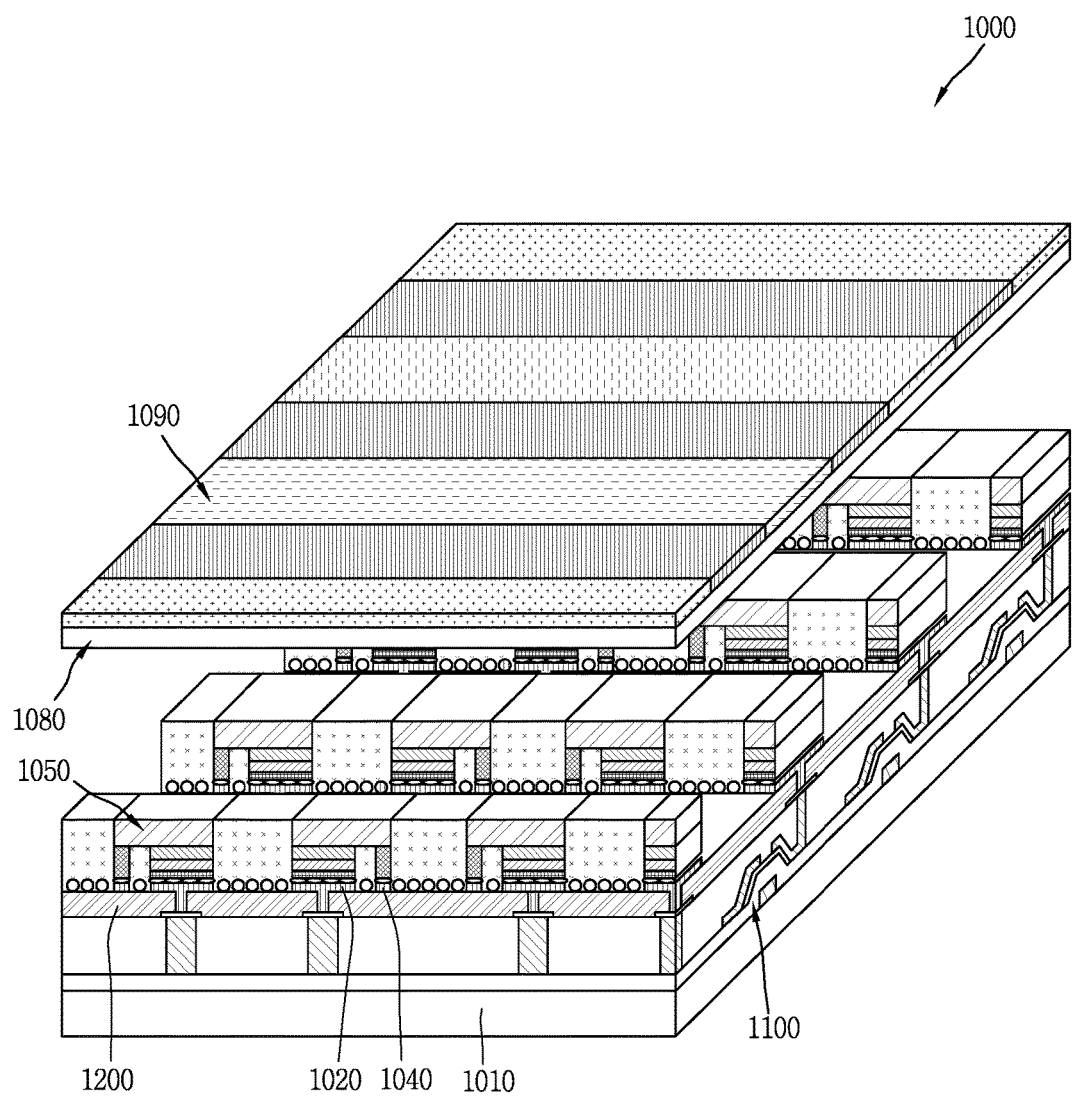
FIG. 10 is an enlarged view illustrating portion "A" in FIG. 1 illustrating another embodiment of the present disclosure to which a novel type semiconductor light emitting device is applied.
Figure 11:
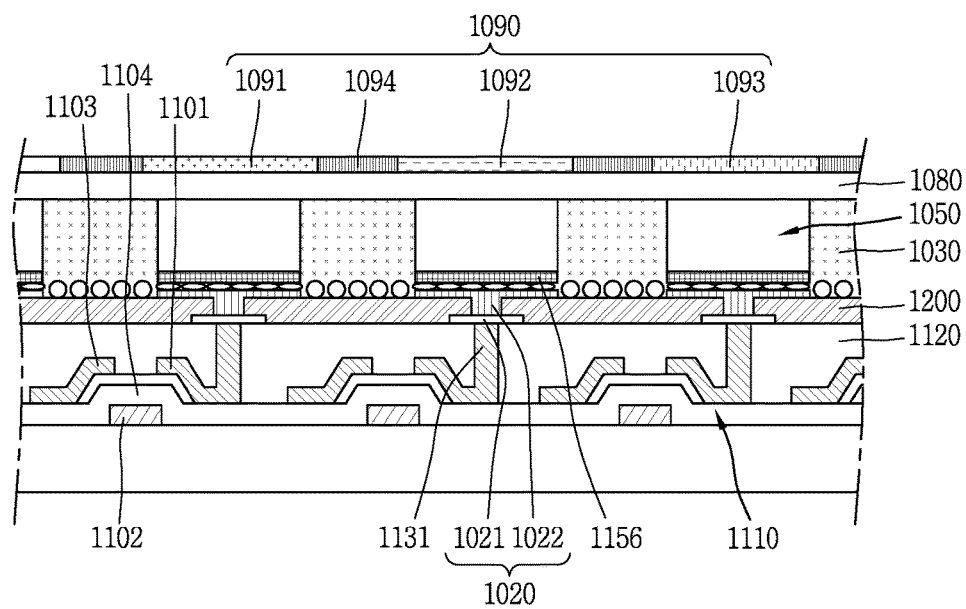
FIGS. 11 and 12 are cross-sectional views taken along line E-E and line F-F, respectively, in FIG. 10.
Figure 12:
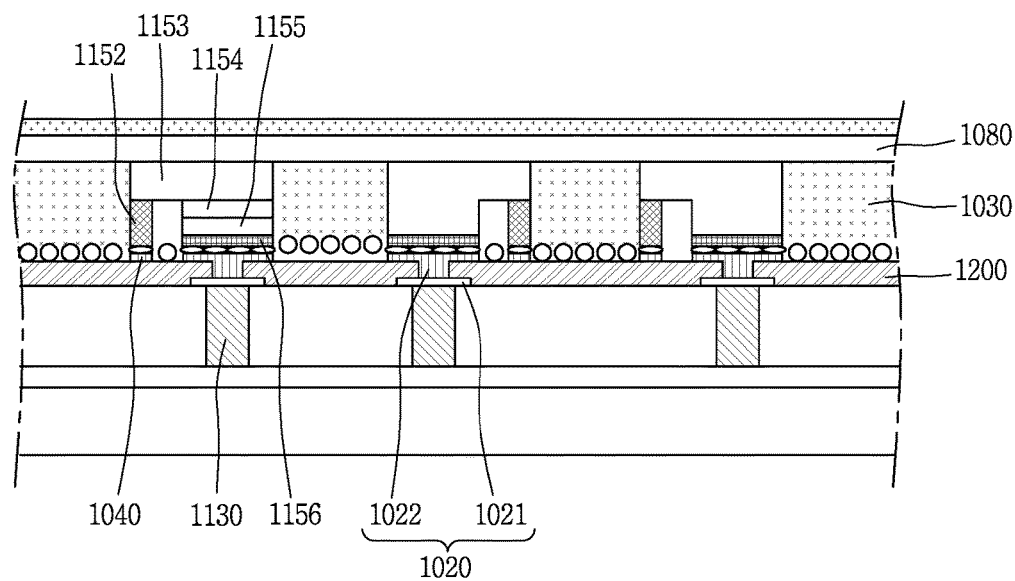

FIG. 10 is an enlarged view illustrating portion "A" in FIG. 1 illustrating another embodiment of the present disclosure to which a novel type semiconductor light emitting device is applied, and FIGS. 11 and 12 are cross-sectional views taken along line E-E and line F-F, respectively, in FIG. 10. According to the drawings of FIGS. 10, 11 and 12, a display device 1000 using an active matrix type semiconductor light emitting device is illustrated as a display device 1000 using a semiconductor light emitting device.

The display device 1000 forms a structure in which a plurality of semiconductor light emitting devices 1050 are electrically connected to a first electrode 1020 and a second electrode 1040 formed on a substrate 1010. The substrate 1010 as a wiring substrate on which the first electrode 1020 is disposed may include polyimide (PI) to implement a flexibly display device. In addition, any material may be used for the substrate 1010 if it is an insulating and flexible material.

The semiconductor light emitting device 1050 may be a flip chip type light emitting device. However, the present disclosure is not limited to this, and a semiconductor light emitting device with a vertical type structure may be used. The semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154 and a second conductive electrode 1152 fainted on the second conductive semiconductor layer 1153.

More specifically, the first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and an n-type semiconductor layer, respectively. However, the present disclosure is not limited to this, and may also have an illustration in which the first conductive type is an n-type and the second conductive type is a p-type.

According to the drawing, the first electrode 1020 as a pixel electrode provided for each pixel may be electrically connected to the first conductive electrode 1156. On the contrary, the second electrode 1040 may be a common electrode electrically connected to the second conductive electrode 1152. In this instance, the second electrode 1040 may include a plurality of electrode lines. Thus, according to the present example, the semiconductor light emitting device 1050 is electrically connected to a common electrode and a pixel electrode portion provided for each pixel to form an individual pixel.

Here, a blue light emitting diode for emitting blue light may be used for the semiconductor light emitting device 1050, and a phosphor layer 1080 capable of converting a wavelength of light emitted from the light emitting device 1050 may be located on the semiconductor light emitting device 1050. For example, the phosphor layer 1080 may be a yellow phosphor layer capable of converting blue light into white light when mixed with the blue light.

A color filter portion 1090 may be disposed to cover the semiconductor light emitting device to implement three primary colors such as red (R), green (G) and blue (B) using white light converted by the phosphor layer 1080. In other words, a red (R) filter 1091, a green (G) filter 1092, and a blue (B) filter 1093 may be provided thereon, and a pixel formed by each light emitting device may form a sub-pixel, and such three sub-pixels may form a pixel.

Furthermore, the display device may further include a black matrix 1094 disposed between each filter to enhance the contrast of the color filter portion 1090. The black matrix 1094 can be formed so a gap is made between filters, and a black material fills into the gap. Through this, the black matrix 1094 may enhance the contrast between light and shade while at the same time absorbing external light reflection.

Further, the pixel electrode portion may be connected to a thin film transistor (TFT) 1100 to implement an active matrix type display. The thin film transistor 1100 has a source region 1101, a drain region 1103 and a channel region 1104, and a gate electrode 1102 is located in the channel region 1104. Here, the source region 1101 is electrically connected to the pixel electrode portion to actively control a pixel to be emitted by the driving of the thin film transistor 1100.

The thin film transistor 1100 may be coated by an interlayer insulating layer 1120. A gap between individual thin film transistors 1100 may be large, and the interlayer insulating layer 1120 is disposed between the gap. According to an embodiment of the present disclosure, a sub-pixel having a sufficient brightness may be implemented using a semiconductor light emitting device in a small size to increase a distance between individual pixels, thereby implementing a flexible display device due to the increased distance.

According to the drawing, an electrical connection between the semiconductor light emitting device 1050 and the pixel electrode portion and common electrode may be performed by the conductive adhesive layer 1030. As shown in a display device described above with reference to FIGS. 1 through 9, the conductive adhesive layer 1030 may be an anisotropy conductive film (ACF), an anisotropy conductive paste, a solution containing conductive particles, or the like. The conductive adhesive layer 1030 can be formed of a non-transparent material to prevent the semiconductor light emitting devices from causing interference of mixed colors therebetween.

In this instance, the process of placing an anisotropy conductive film or the like onto the pixel electrode portion and common electrode, and then applying heat or pressure to the semiconductor light emitting device 1050 to bond them to each other may be performed. During the process, when an anisotropy conductive film is placed between the interlayer insulating layer 1120 and the semiconductor light emitting device 1050, it may cause a problem in that the thin film transistor or semiconductor light emitting device is destroyed due to adhesion between ceramic thin films.

According to the drawing, in order to alleviate or prevent such a problem, a buffer layer 1200 is disposed between the thin film transistor 1100 and the conductive adhesive layer 1030. The buffer layer 1200 is formed of an elastic material to protect the thin film transistor (or semiconductor light emitting device).

According to the drawing, the buffer layer 1200 may be disposed on the interlayer insulating layer of the thin film transistor, and formed of a polymer based or epoxy based material having an elasticity. In this instance, the buffer layer 1200 can be formed of a material with a higher elasticity than that of the interlayer insulating layer of the thin film transistor. Furthermore, the buffer layer 1200 can be formed of a material with a low strength than that of the interlayer insulating layer. In another example, the buffer layer 1200 may include a polymer based material having an adhesiveness along with an elasticity.

Furthermore, the buffer layer 1200 may be disposed at an opposite side to the color filter portion 1090 based on the semiconductor light emitting device 1050, and have a non-transparent property. In this instance, the buffer layer may include a white colored material to reflect light emitted from the semiconductor light emitting device or include a black colored material to absorb the light so as to increase contrast ratio.

According to the drawing, at least part of the pixel electrode portion is disposed on the buffer layer 1200, and electrically connected to the semiconductor light emitting device through the conductive adhesive layer 1030. More specifically, the pixel electrode portion may include a first pixel electrode 1021 and a second pixel electrode 1022.

The first pixel electrode 1021 may be an electrode disposed on the interlayer insulating layer 1120 of the thin film transistor 1100. For example, a source region 1101 of the thin film transistor 1100 is electrically connected to the first pixel electrode 1021. In this instance, the source region 1101 and first pixel electrode 1021 may be electrically connected to each other by a through electrode 1131 passing through the interlayer insulating layer 1120.

The second pixel electrode 1022 is extended to one surface of the buffer layer 1200 through the buffer layer 1200 from the first pixel electrode 1021. One surface of the buffer layer 1200 is a surface covered by the conductive adhesive layer 1030, and the other surface that is an opposite surface to the one surface of the buffer layer 1200 may be a portion for covering the interlayer insulating layer 1120. In this instance, the first pixel electrode 1021 is disposed at a side of the other surface of the buffer layer 1200, and the second pixel electrode 1022 is extended from the other surface of the buffer layer 1200 to one surface thereof, and at least part thereof is inserted into the conductive adhesive layer 1030. Through the structure, the second pixel electrode 1022 can be electrically connected to the first conductive electrode 1156 of the semiconductor light emitting device 1050.

Furthermore, at least one common electrode can be formed on one surface of the buffer layer 1200. For example, a plurality of electrode lines of the second electrode 1040 formed as the common electrode are disposed on one surface of the buffer layer 1200, and electrically connected to the second conductive electrode 1152 of the semiconductor light emitting device through the conductive adhesive layer 1030.

According to an embodiment of the present disclosure as described above, defects due to a crack can be reduced by the buffering of the buffer layer, thereby enhancing a yield during a wiring process of the display device, and implementing an electrical connection path with higher reliability. Further, the buffer layer described in the present example may be applicable to various types of display devices. Hereinafter, various modification examples of the present disclosure will be described in more detail with reference to the accompanying drawings.

Figure 13:
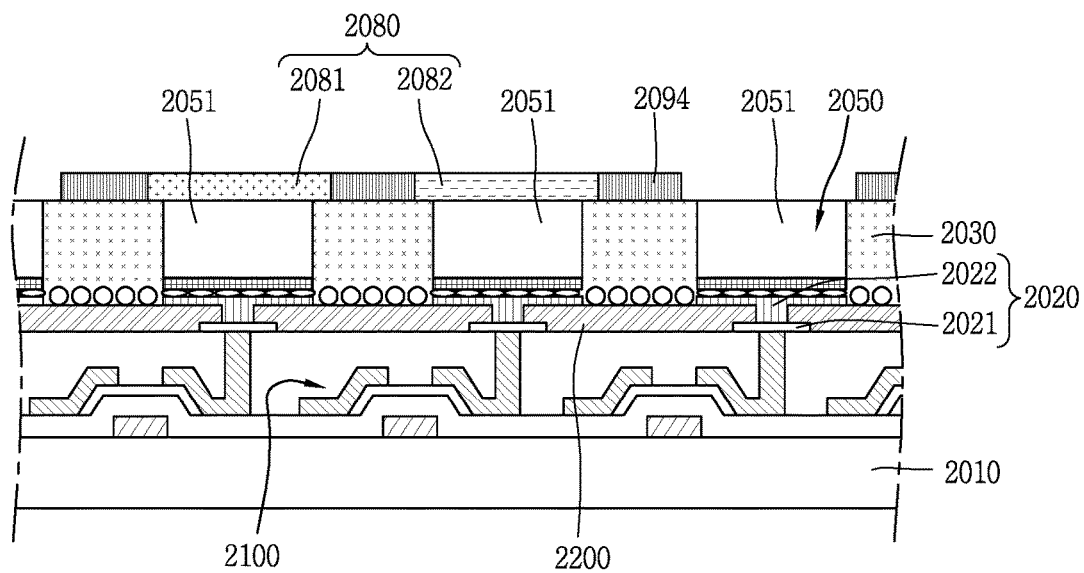
FIGS. 13 and 14 are cross-sectional views illustrating another embodiment of the present disclosure.
Figure 14:
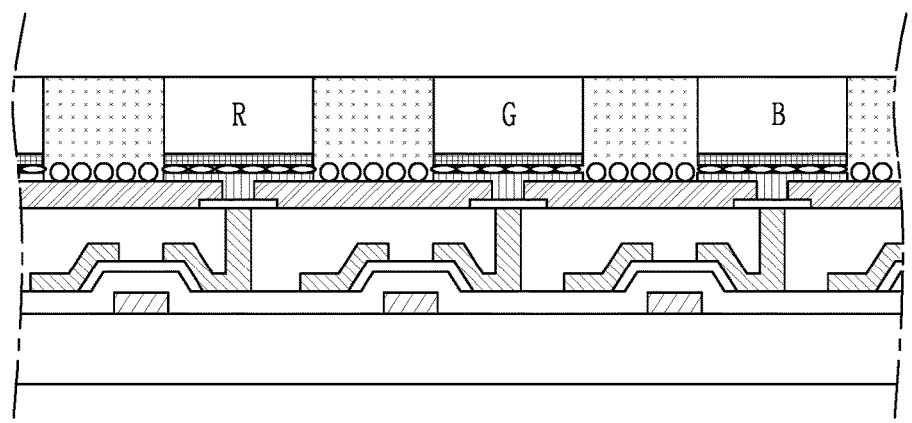

FIGS. 13 and 14 are cross-sectional views illustrating another embodiment of the present disclosure. First, referring to FIG. 13, a structure in which a phosphor layer implements three primary colors such as red (R), green (G) and blue (B) instead of a color filter portion in the foregoing example with reference to FIGS. 10, 11 and 12 is allowed.

In this instance, the foregoing structure described above with reference to FIGS. 10, 11 and 12 may be applicable to a structure including a first electrode 2020, a second electrode, a light emitting device 2050, a conductive adhesive layer 2030, a thin film transistor passive safely system 2100, a buffer layer 2200, and the like, and the description thereof will be substituted by the earlier description.

According to the drawing, a phosphor layer 2080 may be located on an outer surface of the semiconductor light emitting device 2050. For example, the semiconductor light emitting device 2050 is a blue semiconductor light emitting device for emitting blue (B) light, and the phosphor layer 2080 performs a function of converting the blue (B) light into the color of a sub-pixel. The phosphor layer 2080 may be a red phosphor 2081 or green phosphor 2082 constituting an individual pixel.

As described above, according to a display device of the present example, a blue semiconductor light emitting device may be disposed below the red phosphor 2081 or green phosphor 2082, and the conductive adhesive layer 2030, buffer layer 2200 and thin film transistor 2100 may be sequentially disposed below the blue semiconductor light emitting device.

In other words, the red phosphor 2081 capable of converting blue light to red (R) light may be deposited on a blue semiconductor light emitting device 2051 at a position for implementing a red sub-pixel, and the green phosphor 2082 capable of converting blue light to green (G) light may be deposited on a blue semiconductor light emitting device 2051 at a position for implementing a green sub-pixel. Furthermore, only the blue semiconductor light emitting device 2051 may be exclusively used at a portion for implementing a blue sub-pixel. In this instance, sub-pixels such as red (R), green (G) and blue (B) may implement one pixel.

Furthermore, a black matrix 2094 may be disposed between each phosphor layer to enhance contrast. In other words, the black matrix 2094 may enhance the contrast of brightness. Referring to FIG. 14, a structure in which each semiconductor light emitting device 3050 implements three primary colors such as red (R), green (G) and blue (B) without a color filter portion in the foregoing example with reference to FIGS. 10, 11 and 12 is allowed.

According to the drawing, for each semiconductor light emitting device 2050, indium (In) and/or aluminum (Al) are added together to a base material of gallium nitride (GaN) to implement a high-power light emitting device for emitting various lights including blue. In this instance, the semiconductor light emitting device 2050 may be a red, a green or a blue semiconductor light emitting device to implement each sub-pixel. For instance, the red, green and blue semiconductor light emitting devices (R, G, B) are alternately disposed, and red, green and blue sub-pixels constitute one pixel by the red, green and blue semiconductor light emitting devices, thereby implementing a full color display.

Further, as shown in the foregoing example, there is a problem due to a restriction on gradation expression in an active matrix type display. The present disclosure presents a method for expressing gradation as described above, and hereinafter, the method will be described in more detail with reference to the accompanying drawings.

Figure 15:
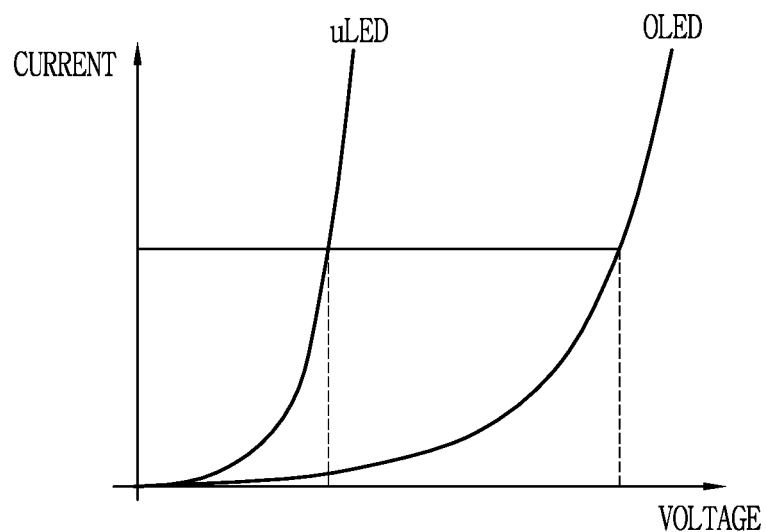
FIG. 15 is a graph illustrating a margin of gradation expression.
Figure 16:
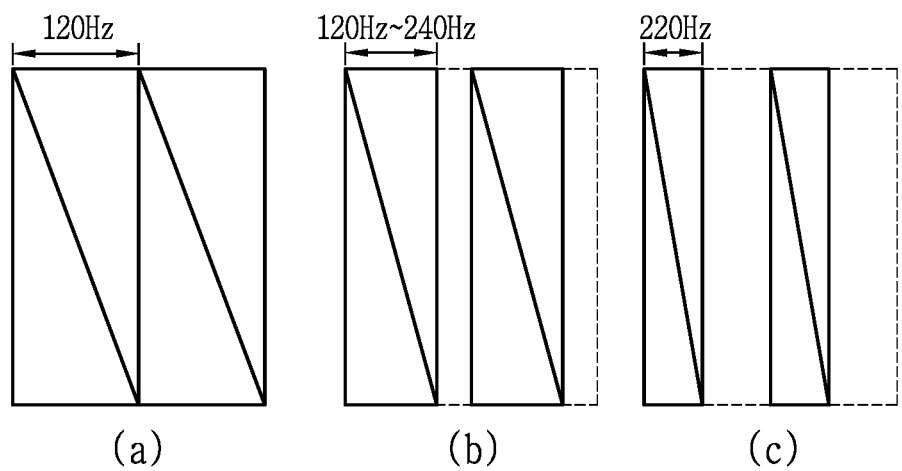
FIG. 16 is a conceptual view illustrating a control method associated with the present disclosure.
Figure 17:
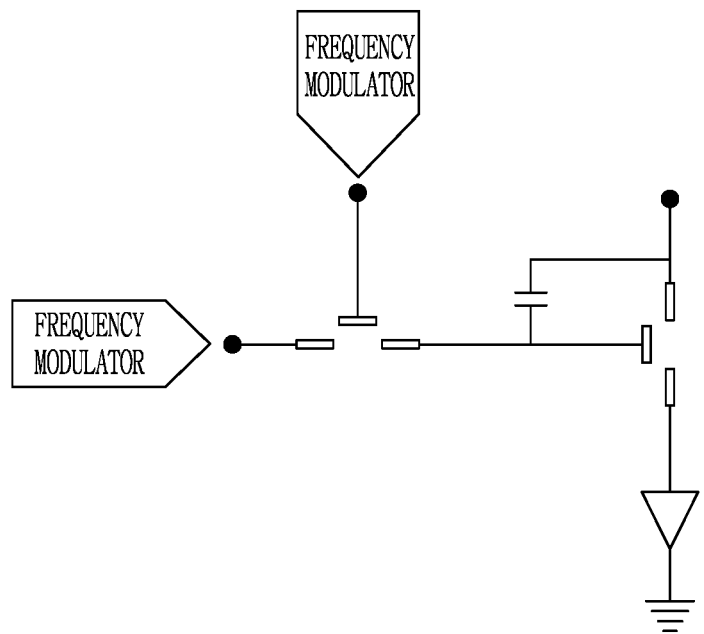
FIG. 17 is a circuit diagram illustrating implementing a control method of FIG. 16.

FIG. 15 is a graph illustrating a margin of gradation expression, and FIG. 16 is a conceptual view illustrating a control method associated with the present disclosure, and FIG. 17 is a circuit diagram illustrating implementing a control method of FIG. 16.

Referring to FIG. 15, in case of an operating voltage for achieving the same luminance, it is seen that a small-sized light emitting diode (ultra light emitting diode, ULED) is very narrow compared to an organic electro-luminescence device (OLED). In other words, it is seen that a margin to the operating voltage thereof is small in case of the ultra light emitting diode since it reaches a target current value even at a small operating voltage. Accordingly, another method is required due to a small operation voltage margin to express gradation using the ultra light emitting diode.

Referring to FIG. 16, the ultra light emitting diode can be controlled such that an operating frequency thereof varies according to a level of gradation. In other words, according to the present example, gradation expression is divided by frequencies. For example, the level of gradation is partitioned into a first level with a high gradation (FIG. 16A), a second level with a middle gradation, and a third level with a low gradation (FIG. 16B), and the operating frequency of the first level is lower than that of the third level (FIG. 16C), and an operating frequency of the first level is lower than that of the third level. More specifically, the first level corresponds to a high gradation, and operates at a frequency of 120 Hz. The second level is a middle gradation, and operates at frequencies of 120 to 240 Hz, and the third level is a low gradation, and operates at a frequency of 240 Hz.

Furthermore, the second level or third level may have an idle time during an operating period of the semiconductor light emitting device. In order to implement such an operation, a frequency modulator may be provided in an AM equivalent circuit in the present example as illustrated in FIG. 17.

It may operate at 60 to 120 Hz during the AM operation, but in case of a ultra light emitting diode, it is important to secure a margin to gradation expression due to a small operating margin. According to the present example, as described above, gradation may be partitioned into any levels, and a higher frequency, for example, above 120 Hz, may be used and an idle time may be applied to a low gradation, thereby maximizing gradation expression power.

In a display device according to an embodiment of the present disclosure, an impact applied to the display device can be decentralized during a bonding process of wiring electrodes and semiconductor light emitting devices by a buffer layer. Thus, it is possible to alleviate or prevent a thin film transistor from being damaged or destroyed during the bonding process.

Furthermore, defects due to a crack can be reduced by the buffering of a buffer layer, thereby enhancing a yield during a wiring process of the display device, and implementing an electrical connection path with higher reliability. An operating frequency of the semiconductor light emitting device may vary, thereby solving a problem of causing restriction in gradation expression power.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A display device, comprising:
   a pixel electrode portion electrically connected to a thin film transistor;
   a semiconductor light emitting device configured to emit light to form an individual pixel, and including a conductive electrode;
   a conductive adhesive layer adhered to the semiconductor light emitting device, and configured to electrically connect the pixel electrode portion to the conductive electrode; and
   a buffer layer including an elastic material to protect the thin film transistor, and disposed directly between the thin film transistor and the conductive adhesive layer.

2. The display device of claim 1, wherein the elastic material includes a polymer based or epoxy based material.

3. The display device of claim 2, wherein the polymer based material has an adhesiveness.

4. The display device of claim 1, wherein the elastic material has an elasticity higher than that of an interlayer insulating layer of the thin film transistor.

5. The display device of claim 1, further comprising:
   a color filter portion covering the semiconductor light emitting device to implement red (R), green (G) and blue (B).

6. The display device of claim 5, wherein the buffer layer is disposed at an opposite side to the color filter portion based on the semiconductor light emitting device, and has a non-transparent property.

7. The display device of claim 1, wherein the buffer layer is configured to reflect light emitted from the semiconductor light emitting device.

8. The display device of claim 7, wherein the buffer layer includes a white colored material.

9. The display device of claim 1, wherein the pixel electrode portion comprises:
   a first pixel electrode disposed on an interlayer insulating layer of the thin film transistor; and
   a second pixel electrode extended to one surface of the buffer layer through the buffer layer from the first pixel electrode.

10. The display device of claim 9, further comprising:
    at least one common electrode on one surface of the buffer layer.

11. The display device of claim 10, wherein the second pixel electrode is electrically connected to a first conductive electrode of the semiconductor light emitting device, and
    wherein the common electrode is electrically connected to a second conductive electrode of the semiconductor light emitting device.

12. The display device of claim 9, wherein at least part of the second pixel electrode is inserted into the conductive adhesive layer.

13. The display device of claim 1, wherein an operating frequency of the semiconductor light emitting device varies according to a level of gradation.

14. The display device of claim 13, wherein the level of gradation is partitioned into a first level with a high gradation, a second level with a middle gradation, and a third level with a low gradation, and the operating frequency of the first level is lower than that of the third level.

15. The display device of claim 14, wherein the second level or third level has an idle time during an operating period of the semiconductor light emitting device.

* * * * *